United States Patent [19]

Nathanson et al.

[11] 4,148,052
[45] Apr. 3, 1979

[54] RADIANT ENERGY SENSOR

[75] Inventors: Harvey C. Nathanson, Pittsburgh; Richard N. Thomas, Murrysville, both of Pa.

[73] Assignee: Westinghouse Electric Corp., Pittsburgh, Pa.

[21] Appl. No.: 841,408

[22] Filed: Oct. 12, 1977

[51] Int. Cl.² ............................................. H01L 27/14
[52] U.S. Cl. ........................................ 357/30; 357/24; 357/55; 357/60
[58] Field of Search .......................... 357/30, 55, 24, 60

[56] References Cited

U.S. PATENT DOCUMENTS

| 3,444,381 | 5/1969 | Wendland | 250/211 |
|---|---|---|---|
| 3,590,344 | 6/1971 | Roberts | 317/235 |
| 3,763,372 | 10/1973 | Fedotowsky | 250/41 J |
| 3,930,161 | 12/1975 | Ameurloine | 250/370 |
| 3,940,602 | 2/1976 | Lagnado | 235/181 |
| 3,989,946 | 11/1976 | Chapman | 250/332 |
| 4,029,962 | 6/1977 | Chapman | 250/338 |
| 4,063,268 | 12/1977 | King | 357/30 |
| 4,106,046 | 8/1978 | Nathanson | 357/30 |

*Primary Examiner*—Stanley D. Miller, Jr.
*Attorney, Agent, or Firm*—R. M. Trepp

[57] ABSTRACT

An improved radiant energy sensor incorporating a number of elongated detectors, reflecting means for reflecting incident light into the elongated detectors, and circuitry on a crystalline substrate, is described wherein the reflecting means directs radiant energy into the elongated detectors.

15 Claims, 26 Drawing Figures

FIG.1

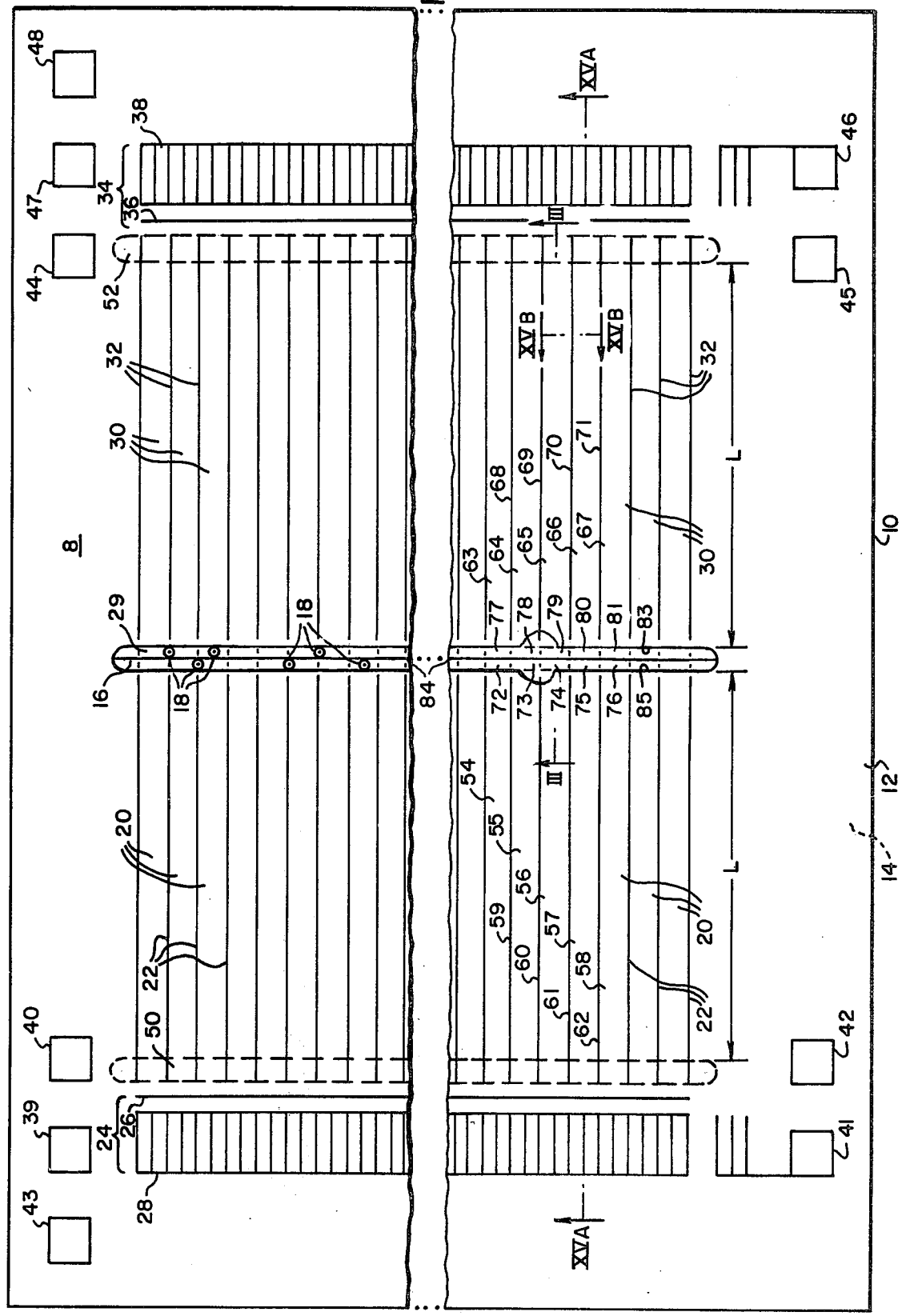

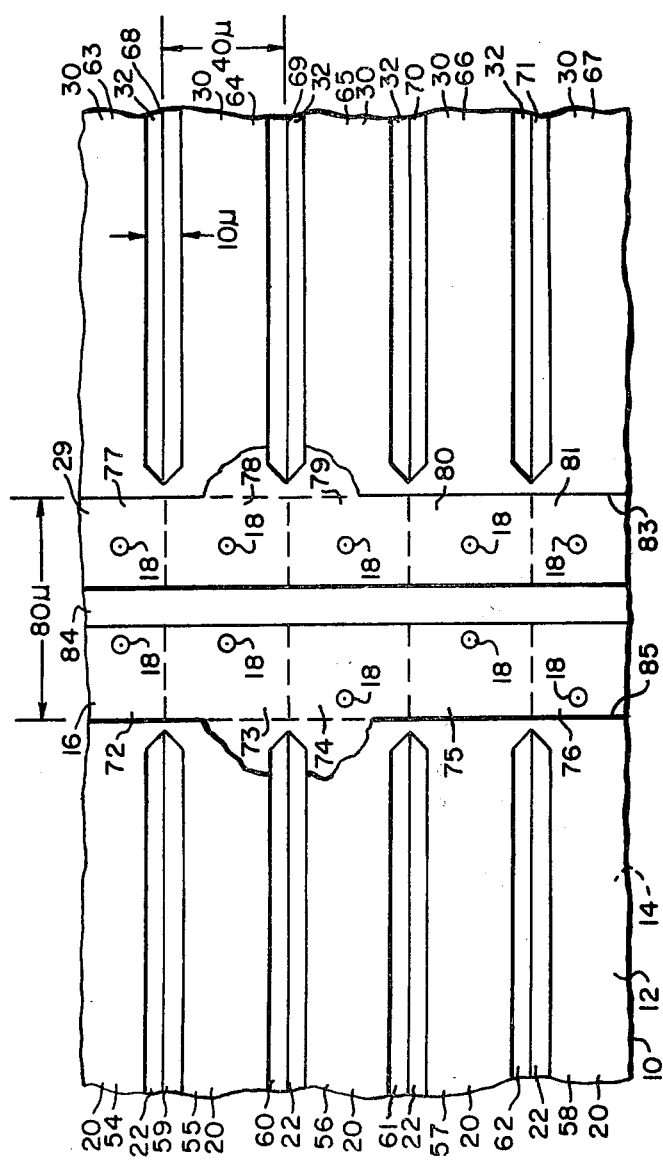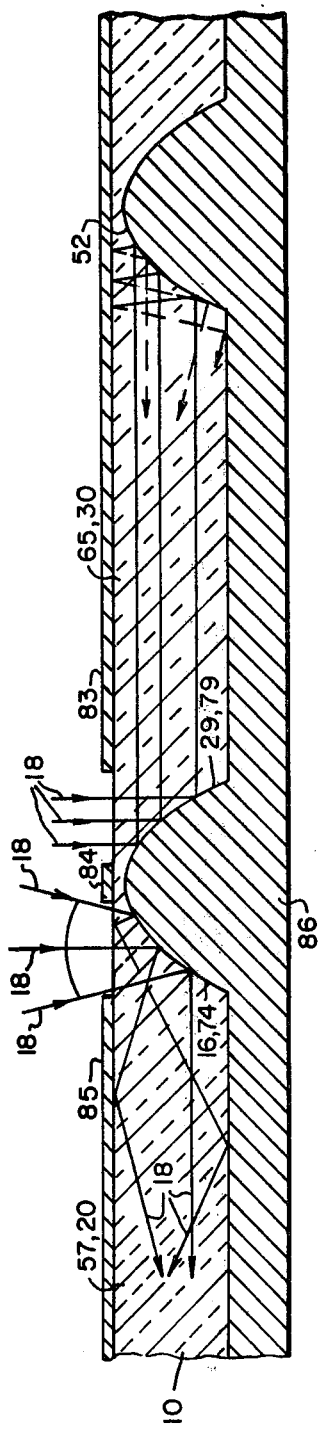

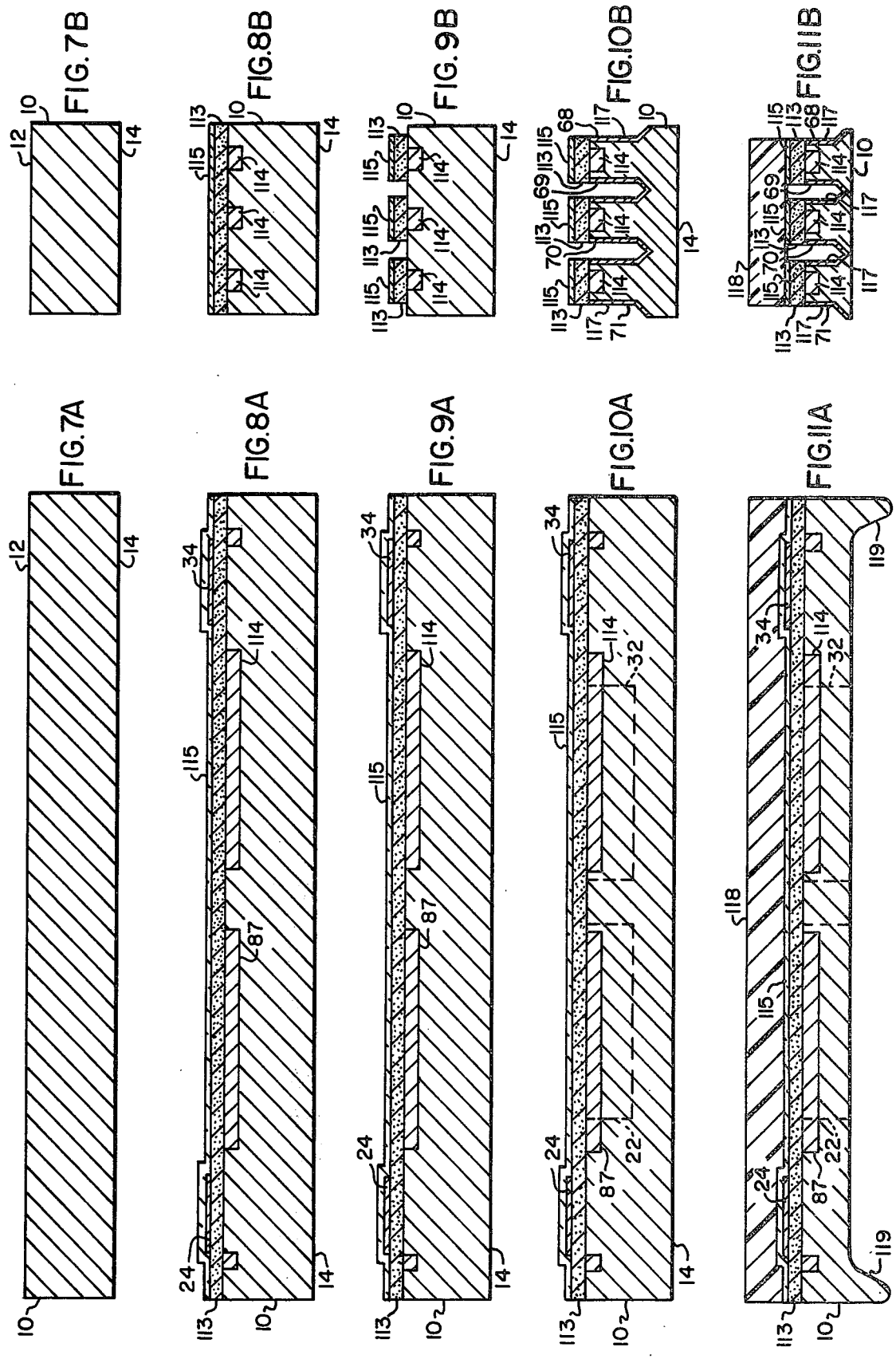

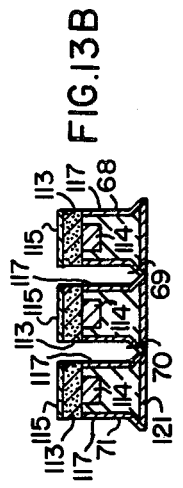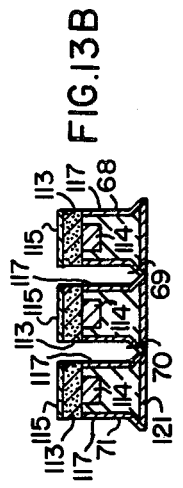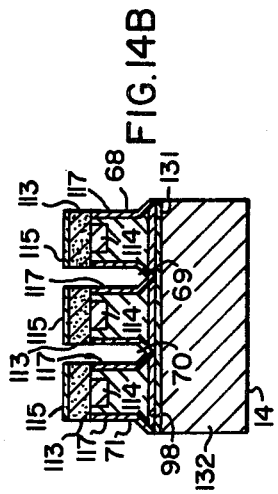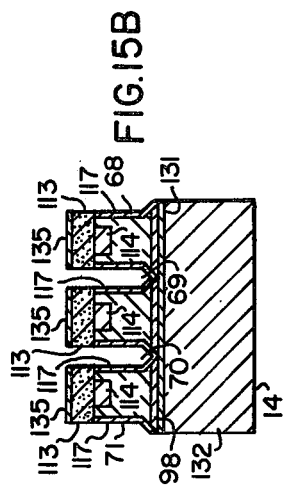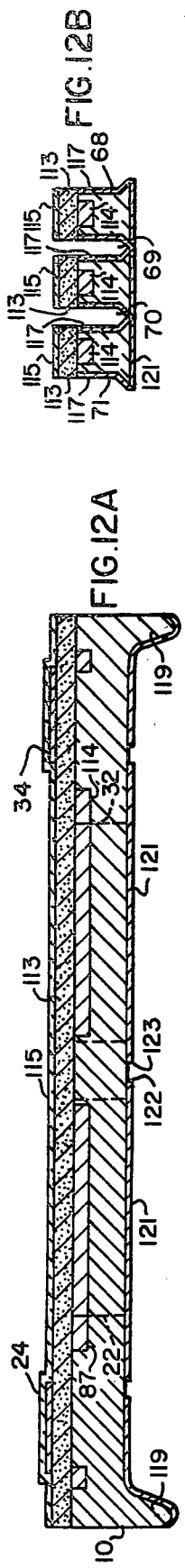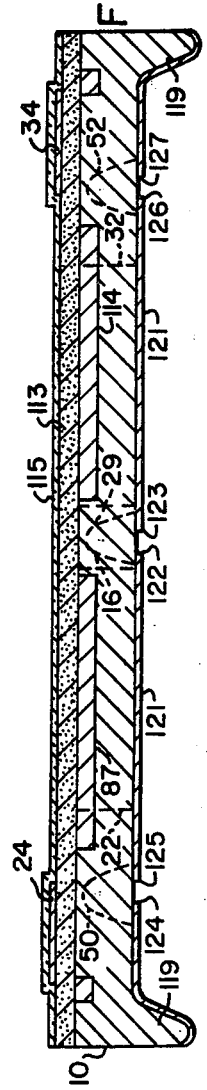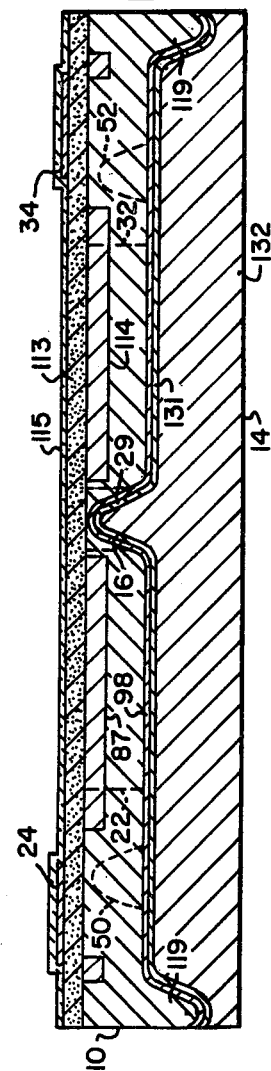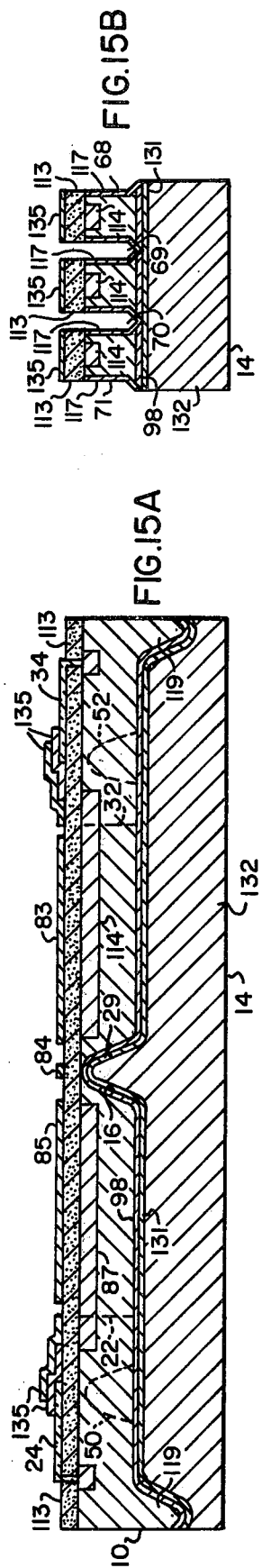

RADIANT ENERGY SENSOR

BACKGROUND OF THE INVENTION

This invention relates to radiant energy sensors, and more particularly, to an improved radiant energy sensor employing a plurality of elongated detectors, reflecting means and circuitry on a crystalline substrate.

DESCRIPTION OF THE PRIOR ART

In the prior art, sensors for radiation in the infrared region, such as from 3 to 12 microns in wavelength, utilize detectors such as lead tin telluride or mercury cadmium telluride, lead sulfide, lead selenide, or lead telluride, which were combined with separate signal processing circuitry which incorporated such features as antiblooming, background subtraction and time delay integration to provide a desired output. The signal processing circuitry could be bipolar, metal oxide silicon (MOS) or charge coupled device (CCD), which are generally fabricated on silicon substrates. The detectors and the signal processing circuitry were assembled incorporating hybrid packaging systems utilizing a handmade interconnection scheme, such as wire bonding or epoxied wires. Hybrid packaging systems have a lower sensor packing density, lower reliability and an increased cost as compared to a monolithic integrated circuit containing the entire sensor.

A monolithic structure incorporating both the detectors for infrared radiation and the single processing circuitry utilizing charge coupled devices was described by J. C. Frazer et al, entitled "An Extrinsic Silicon Charge Coupled Device For Detecting Infrared Radiation", in the "Technical Digest" of the International Electronic Devices Meeting, sponsored by IEEE group on Electron Devices held in Washington, D.C. (1974). However, poor isolation between extrinsic silicon sensor elements was reported caused by both optical and electrical cross-talk between sensor elements resulting in degraded detector sharpness and modulation transfer function (MTF). An example of a monolithic structure to provide minimum optical cross-talk and minimum electrical cross-talk between sensor elements or detectors is described by R. A. Chapman and K. E. Bean in U.S. Pat. No. 3,989,946, issued on Nov. 2, 1976. The patent to Chapman et al shows a linear array and a two dimensional array of thickness mode detectors where isolation between adjacent detectors is provided by etching narrow slots between the detectors. A thickness mode detector is one which utilizes a thick substrate of silicon and where the detectors are vertical with a top and bottom electrode to collect charge when radiant energy passes through the top electrode into the detector material. Isolation between adjacent detectors in a matrix or two dimensional array is provided by Chapman et al. by etching a number of parallel slots from the top surface towards the center of the thick substrate and etching a number of parallel slots from the bottom surface towards the center which are oriented transverse to the slots in the top surface. Silicon material, however, remains in the center joining all detectors to provide mechanical support of the detectors in the array.

In the prior art, in order to hold radiant energy within a detector material to increase its path length, and hence its likelihood of absorption, reflective surfaces have been utilized. One example of a reflective surface to increase the path length of radiant energy is described by P. H. Wendland in U.S. Pat. No. 3,444,381, issued on May 13, 1969. The patent to Wendland shows a reflective surface at about the critical angle relative to the index of refraction of silicon to provide total internal reflection of the radiant energy to keep the radiant energy within the detector volume of a silicon photodiode. Metal is shown deposited on the reflective surface to facilitate reflection.

It is therefore desirable to provide a completely monolithic infrared sensor including detectors and signal processing circuitry wherein elongated detectors may be placed parallel with the surface of a silicon substrate with single processing circuitry formed on the silicon surface for processing the signals from the detectors, and where radiant energy transverse to the surface of the silicon and elongated detectors is directed into the elongated detectors by a reflecting surface formed in the silicon substrate.

It is desirable to have a fully monolithic focal plan detector array with a transverse electrode configuration to incident radiation deployed to provide high speed infrared detection fully compatible with, for example, a standard 525 line TV display.

CROSS-REFERENCE TO A COPENDING APPLICATION

This application is cross-referenced to copending application Ser. No. 762,544, filed on Jan. 26, 1977 and assigned to the assignee which describes a sensor for converting radiant energy into electrical signals utilizing a substrate having a plurality of elongated detectors positioned for receiving radiant energy incident upon the edge of the substrate.

SUMMARY OF THE INVENTION

In accordance with the present invention, a sensor is provided for converting radiant energy into electrical signals comprising a crystalline substrate having a predetermined crystalline orientation and an upper substrate surface, the substrate including a plurality of elongated detectors for generating electronic charge in response to the passing of radiant energy through the detector, one of the elongated detectors having portions thereof physically separated from adjacent detectors by grooves in the substrate, the grooves extending into the upper surface and having side walls bounded by selected crystalline planes of the substrate for electrically and optically isolating the detector and adjacent detectors from each other, and wherein the crystalline substrate has a first reflecting surface for reflecting incident radiant energy into a plurality of the elongated detectors.

The invention further provides a sensor array for converting radiant energy into electrical signals comprising a crystalline substrate having a predetermined crystalline orientation and an upper and lower substrate surface, the substrate including a plurality of elongated detectors for generating electronic charge in response to the passing of radiant energy through said detector, one of said elongated detectors having portions thereof physically separated from adjacent detectors by grooves in the substrate, the grooves extending from the upper surface towards the lower surface and having side walls bounded by selected crystalline planes of the substrate for electrically and optically isolating the detector and adjacent detectors, and wherein the crystalline substrate has a plurality of reflecting surfaces divided into pairs with each pair positioned adjacent and parallel to one another for reflecting incident radiant energy into a plurality of the elongated detectors, the pairs of reflecting surfaces positioned to form a predetermined pattern for reception of radiant energy.

BRIEF DESCRIPTION OF THE DRAWINGS

FIG. 1 is a plan view of one embodiment of the invention;

FIG. 2 is an enlarged view of a portion of the embodiment of FIG. 1;

FIG. 3 is an enlarged cross-section view along the lines III—III of FIG. 1;

FIGS. 7a through 15a show a cross-section view along the lines XVa—XVa of FIG. 1 illustrating the process steps to fabricate the invention of FIG. 1;

FIGS. 7b through 15b show a cross-section view along the lines XVB—XVB of FIG. 1 illustrating the process steps to fabricate the invention of FIG. 1.

DESCRIPTION OF THE PREFERRED EMBODIMENTS

Figure 4:
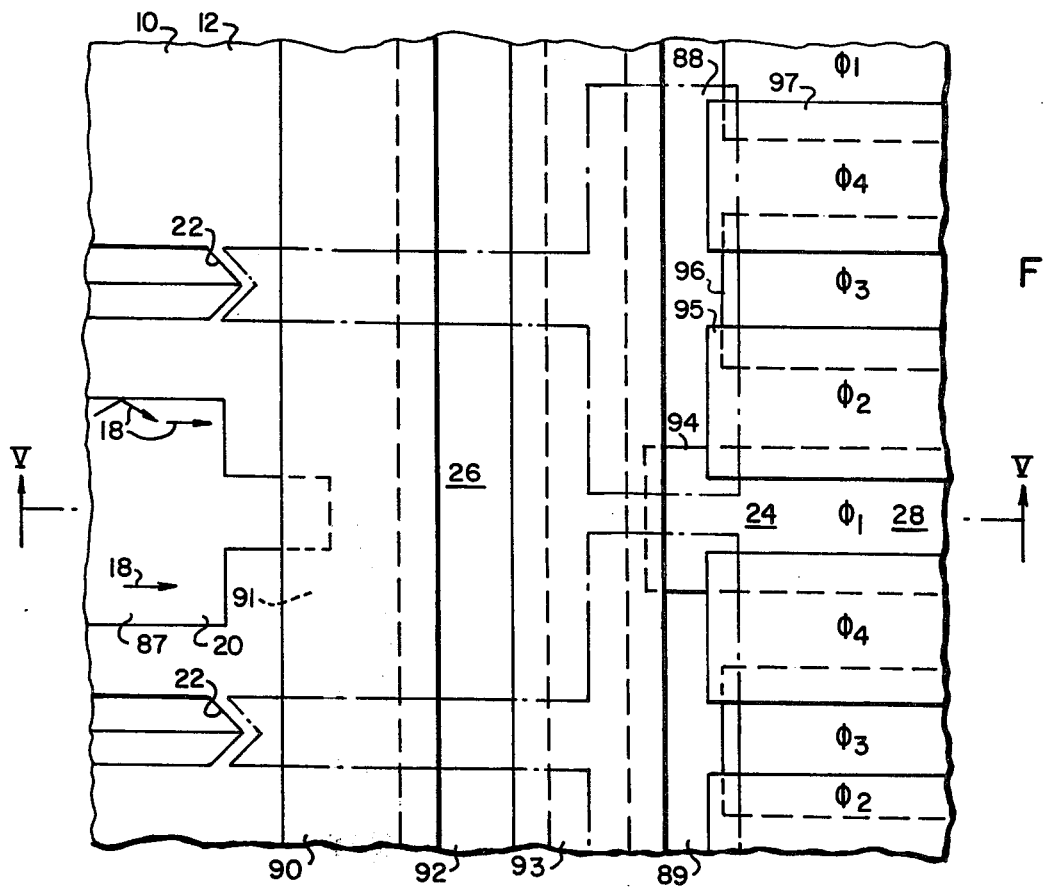
FIG. 4 is a plan view of signal processing circuitry.

Referring to FIG. 1, a plan view of one embodiment of the invention is shown. Crystalline substrate 10 has a predetermined crystalline orientation with a selected crystalline plane located in or close to the upper surface 12. The crystalline substrate 10 may, for example, be silicon with the (110) plane located in or close to the upper substrate surface 12. Crystalline substrate 10 may also be crystalline material such as indium antimonide or germanium which also have selective etch properties. Beneath the upper surface 12 on the underside of substrate 10 is the lower substrate surface 14. Crystalline substrate 10 has a first reflecting surface 16 for reflecting incident radiant energy 18 into substrate 10. Radiant energy 18 may, for example, originate from A view of the earth, sky, or sea containing inorganic or organic matter which radiates energy. The radiant energy 18 entering substrate 10 may represent a field of view or image of a view from an airplane towards the earth. Within substrate 10 are a plurality of elongated detectors 20 for receiving radiant energy 18 after it is reflected by first reflecting surface 16. Elongated detectors 20 generate electronic charge in response to the radiant energy 18. The elongated detectors 20 are separated from one another by grooves 22 in the crystalline substrate 10 which function to optically and electrically isolate adjacent detectors. The grooves or slots may extend from the upper substrate surface 12 to some point below the upper substrate surface or the grooves may extend from the upper substrate surface 12 all the way through to the lower substrate surface 14. Of course, if the grooves do not completely physically isolate adjacent detectors, then the optical and electrical isolation may be reduced by some degree. The side edges or side walls of groove 22 are bounded by selective planes of the crystalline substrate 10. If the crystalline substrate 10 is silicon, then the side edges or side walls of grooves 22 would be bounded by selective crystalline planes such as the (111) plane.

In addition to the reflecting surface 16, elongated detectors 20 and the grooves 22 within substrate 10 there may also be signal processing circuitry 24 including circuitry for transferring charge from the elongated detectors 20 to itself. A transfer gate 26 provides means for transferring a charge from the elongated detectors 20 at the appropriate time to the signal processing circuitry 24, which may include an analog shift register 28. The analog shift register may, for example, be used to provide time delay and integration (TDI). In time delay and integration a particular point in a scene is moved sequentially from detector to detector. The output of the detector for a particular point in a scene or an image is moved by means of the analog shift register to the output of the next detector 20 which is directed towards the same point on the scene or image and the output of this detector is added to the output of the prior detector 20 to provide a summation of the two detectors. A particular point in a scene or image may be passed from detector to detector such as sixteen or fifty detectors with the detector outputs added to provide an enhanced signal to noise ratio as compared to the signal to noise ratio of the output of one detector 20. The analog shift register may, for example, utilize charge couple devices (CCD). The transfer gate 26 may, for example, be a metal oxide silicon (MOS) field effect transistor (FET). By placing additional circuitry on the crystalline substrate 10 other signal processing functions may be performed, such as antiblooming and background subtraction. The principal advantage of having signal processing circuitry 24 locating on substrate 10 together with the elongated detectors 20 is that the interconnections between the elongated detectors 20 and the signal processing circuitry 24 may be made with standard integrated circuit interconnections, such as by aluminum metallization or conductive diffusions. In the prior art, handmade interconnections, such as by wire bonding or epoxied wires, were required to interconnect the detector to the signal processing circuitry. As shown in FIG. 1, the elongated detectors on substrate 10 along with the signal processing circuitry 24 including the transfer gate 26 provide a monolithic sensor which can contain complete information processing and utilize integrated circuit technology to provide higher packing density, increased reliability and more economical devices.

FIG. 1 also shows a second reflecting surface 29 positioned adjacent and parallel to the first reflecting surface 16 for reflecting incident radiant energy 18 into a plurality of elongated detectors 30. Elongated detectors 30 have portions thereof physically separated from adjacent detectors by grooves 32 in said substrate. Signal processing circuitry 34 on substrate 10 is coupled to the elongated detectors 30 for processing the outputs of the elongated detectors such as to provide time delay integration. Signal processing 34 may include a transfer gate 36 and an analog shift register 38. The function and structure of reflector 29 corresponds to reflector 16, elongated detectors 20 to 30, grooves 22 to 32 and signal processing circuitry 24 to 34.

Signal processing circuitry 24 may have control and output terminals such as 39 through 43. Signal processing circuitry 34 may have control and output terminals, such as 44 through 47, which function to provide electrical connection for control signals and the output signal. As shown in FIG. 1, elongated detectors 20 and 30 may include a means for reflecting radiant energy 18 at the far end of the detector back through the detectors 20 and 30 towards the point of entry near first and second reflecting surfaces 16 and 29. The back reflector 50 associated with the elongated detectors 20 is shown at the opposite end or left side of elongated detector 20 from the end where light or radiant energy enters the detector near first reflector 16. Back reflector 52 is shown at the right side or at the far end of elongated detectors 30 away from the point where light enters the elongated detectors 30 near second reflecting surface 29. Back reflectors 50 and 52 may be formed by etching a reflecting surface or slot in the upper surface 12 of substrate 10 at the end of the elongated dectectors 20 and 30. Radiant energy 18 which travels through elongated detectors 20 or 30 will be reflected back through the elongated detector by back reflectors 50 and 52 increasing the probability that the radiant energy will be absorbed in the elongated detector. One example of a suitable length for an elongated detector, such as elongated detectors 20 or 30, and indicated as dimension L in FIG. 1, would be on millimeter. It is understood that the elongated detectors 20 and 30 would function correctly without back reflectors 50 and 52 wherein less radiant energy 18 would be absorbed by the elongated detector.

Detectors 54 through 58 are from the group of elongated detectors 20. Grooves 59 through 62 are the grooves between detectors 54 through 58 and are part of the grooves 22. Detectors 63 through 67 are particular detectors of the group of detectors 30 and grooves 68 through 71 are located between detectors 63 through 67 and are part of the grooves 32. Reflector areas 72 through 76 are part of first reflecting surface 16 and designate the reflector area associated with each detector 54 through 58. In other words, radiation 18 striking reflector area 72 will be reflected into detector 54. Reflector areas 77 through 81 are part of second reflecting surface 29 and designate the reflecting area associated for reflecting radiation 18 into each detector 63 through 67.

FIG. 2 is an enlarged view of a portion of the embodiment in FIG. 1. In FIG. 2 the detectors may, for example, be on 40 micron centers having a width of 30 microns separated by a 10 micron wide groove. The grooves 22 and 32 may be, for example, 30 microns deep. An optic shield 83 through 85 which is partially shown in FIG. 2 may cover the top surface of substrate 10 except over reflecting surfaces 16 and 29 to assure that detectors 20 and 30 receive only radiation 18 which has been reflected off reflecting surfaces 16 and 29.

FIG. 3 is an enlarged cross-section view along the lines III—III of FIG. 1. Radiation 18 is shown entering substrate 10 and reflected by reflecting surface 16 and, more particularly, reflector area 74. Radiation 18 passes into detector 57 where it is absorbed. Optical shield 85 functions to reflect radiation 18 back into the detector 57 to contain radiation 18 within the detector. Reflecting surface 16 may be formed, for example, by etching a groove from the underside of substrate 10 into substrate 10. The reflecting surface may form a unique quasi-triangular infrared mirror facet which is formed by the etching and may be filled with reflective metal 86 to assure that all light is reflected off reflecting surface 16. One example of reflective metal 86 may be, for example, copper. The reflective metal may also be deposited along the underside of substrate 10 to a considerable thickness to provide for a good heat sink and transfer medium to a cold finger (not shown), such as one at 50° K. for operation of detectors 20 and 30. Reflecting surface 29 may be formed by the same process that is used to form reflecting surface 16 and may be the other side of the groove etched in substrate 10, as shown in FIG. 3. Back reflector 52 may likewise be formed by etching a groove in substrate 10 to form a quasi-triangular infrared mirror facet. The groove may be filled with reflective metal 86 to assure that all radiation 18 is reflected. Optical shield 83 in the vicinity of back reflector 52 may act in conjunction with back reflector 52 to reflect incident radiation upon optical shield 83 back to back reflector 52 which will re-reflect radiation 18 through detector 65.

FIG. 4 is a plan view of signal processing circuitry 24. Elongated detector 20 has a p+ diffusion 87 on the upper surface 12 of substrate 10 for collecting charge generated by the absorption of infrared radiation 18 passing through and absorbed by detector 20. On either side of detector 20 are grooves 22. Extending from the ends of groove 22 are n+ channel stops 88 and 89, which function to hold the charge from detector 20 between the channel stops 88 and 89. Metallization 90 overlaps p+ diffusion 87 and is coupled to terminal 41, forming an input gate to couple charge from the p+ diffusion 87 to a charge couple device holding well adjacent the input gate 90. Metallization 92 covers holding well 91 and is coupled to terminal 39. Metallization 93 overlaps holding well 91 and functions to transfer the charge from holding well 91 to analog shift register 28. Metallization 93 is coupled to terminal 40 which has an appropriate control signal for controlling the transfer of charge from holding well 91. Metallizations 90, 92 and 93 are insulated from one another and from the substrate material by layers of insulation (not shown for the purposes of simplicity). Analog shift register 28 has metallizations 94 through 97 which are insulated from one another and from substrate 10 and which are coupled to control signals which provide phase 1 through phase 4 on metallizations 94 through 97, respectively. Analog shift register 28 functions as a charge couple device shift register with charge sequentially transferred underneath metallizations 94, 95, 96 and 97, representing one stage or bit of analog shift register 28. Control signals on metallizations 94 through 97 are varied, which are well known in the art, to provide the correct potential in substrate 10 to provide shifting of the charge from underneath one metallization to underneath the adjacent metallization.

Figure 5:
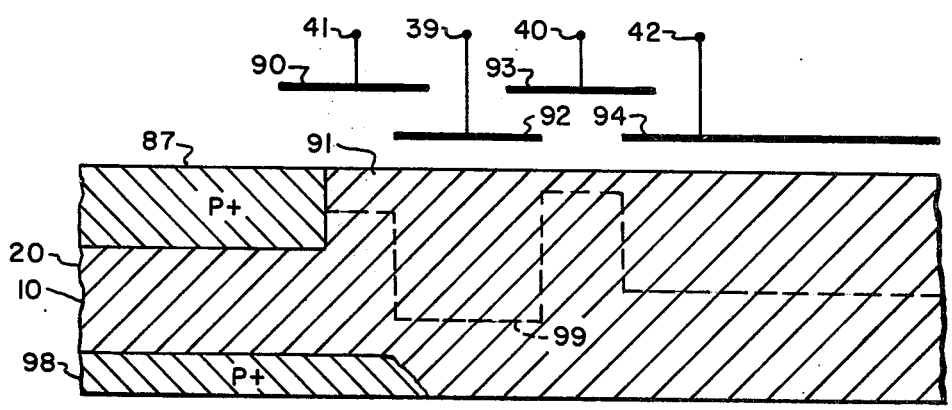
FIG. 5 is a cross-section view along the lines V—V of the circuitry in FIG. 4.

FIG. 5 is a cross-section view along the lines V—V of the circuitry in FIG. 4. In FIG. 5 the lower or bottom p+ diffusion 98 of detector 20 is shown in addition to the top diffusion 87. The field potential line 99 shows a typical surface state potential in substrate 10 when charge is being collected from detector 20 into holding well 91, below metalization 92, prior to transfer to analog shift register 28, below metalization 94. The control voltages on terminals 39 through 42 are well known in the art and are considered conventional. The charge placed under metallization 94 is indicative of the infrared radiation absorbed by detector 20. In one method of operation, the potential of the input gate or metallization 90 is set such that a constant current proportional to radiation 18 enters the holding well 91 over a predetermined sample period. A control voltage on the transfer gate terminal 40, transfers or dumps the charge in holding well 91 into the phase 1 gate of the analog shift register 28, beneath metallization 94. Charge manipulation such as background subtraction and differencing can be applied by additional circuitry before transferring the charge from holding well 91 to analog shift register 28.

Figure 6:
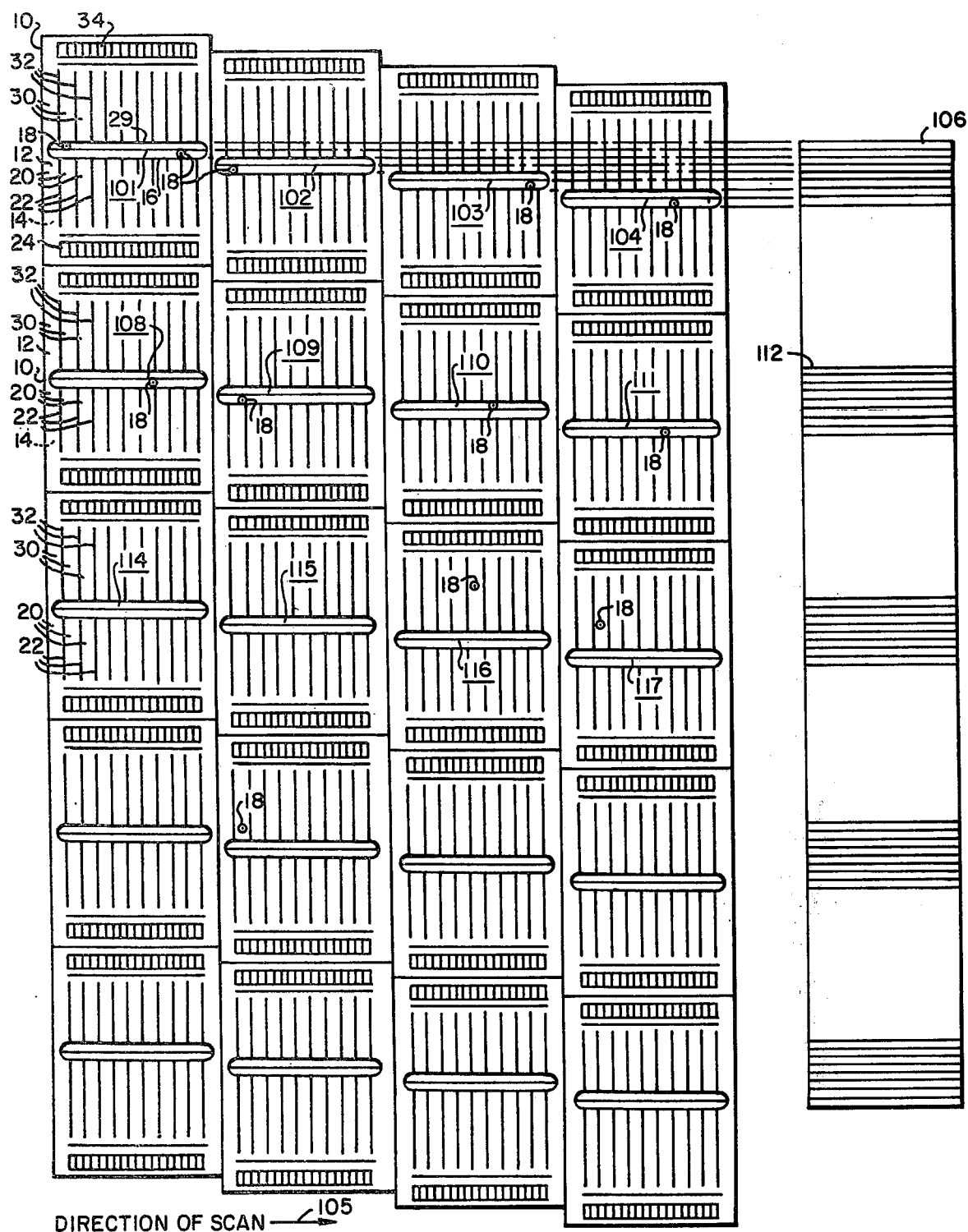
FIG. 6 is an alternate embodiment of the invention.

FIG. 6 is an alternate embodiment of the invention. In FIG. 6, like references are used for functions corresponding to the apparatus of FIG. 1. FIG. 6 shows a sensor array for converting radiant energy into electrical signals and formed on a single crystalline substrate 10 having a predetermined crystalline orientation. Substrate 10 has an upper surface 12 and a lower surface 14. The substrate includes a plurality of elongated detectors 20 and 30 for generating electronic charge in response to the passing of radiant energy through the detectors. One or more of the elongated detectors 20 and 30 have portions thereof physically separated from adjacent detectors by grooves 22 in the substrate 10. The grooves 22 extend from the upper surface 12 towards the lower surface 14 and have side walls bounded by selected crystalline planes of the substrate 10 for electrically and optically isolating one or more detectors 20 and 30 from adjacent detectors. In addition, in FIG. 6 there is a plurality of reflecting surfaces 16 and 29 divided or formed into pairs with each reflecting surface 16 or 29 of the pair positioned adjacent and parallel to one another for reflecting incident radiant energy into a plurality of elongated detectors. The pairs of reflecting surfaces 16 and 29 may be positioned to form a predetermined pattern for reception of radiant energy. For example, in FIG. 6 a staggered row alignment of pairs of reflecting surfaces, such as pairs of reflecting surfaces 101 through 104, is shown along the top of FIG. 6. If an image from a field of view is scanned horizontally, as shown by arrow 105, then by multiplexing at the proper time the outputs of detectors, the radiation from the field of view may be sensed and its signal to noise ratio enhanced using time delay integration for a fixed horizontal sweep to provide a sensor output for each reflecting surface or eight lines, as shown by diagram 106. It is understood for this embodiment that the elongated detectors have signal processing circuitry such as 24 to provide the time delay integration. Likewise, pairs of reflecting surfaces 108 through 111, which are aligned parallel to pairs of reflecting surfaces 101 through 104, will provide eight lines of sensor information when an image is scanned past the detectors in the direction of arrow 105. The eight picture lines are depicted by diagram 112. Additional pairs of reflecting surfaces, such as 114 through 117, may be positioned with a predetermined orientation with respect to pairs of reflecting surfaces 101 through 104 and 108 through 111 to provide a matrix or pattern of pairs of reflecting surfaces, each having associated elongated detectors and signal processing circuitry to provide a sensor. The image in the field of view may be scanned according to the arrangement of the pairs of reflecting surfaces to facilitate forming a complete image of the field of view by multiple scans with the image indexed across the pairs of reflecting surfaces. The advantage of the embodiment in FIG. 6 is that the radiation 18 is transverse to the upper surface 12 of substrate 10, allowing many pairs of reflecting surfaces to intercept the radiation 18. Substrate 10 contains the pairs of reflecting surfaces which are registered or physically arranged with respect to one another at the time they are formed in substrate 10. Registration is therefore built in at the time the pairs of reflecting surfaces are fabricated on substrate 10 which is monolithic in structure, therefore eliminating subsequent registration, such as would be required if the pairs of reflecting surfaces were fabricated on separate substrates and assembled together on a common substrate. In addition, the monolithic construction of the pairs of reflecting surfaces, elongated detectors and signal processing circuitry permits cooling of substrate 10 to a uniform temperature, such as 50° K. It is understood in the embodiment of FIG. 6 that the direction of scan may be orthogonal to arrow 105 in the plane of the sensor or substrate 10 such that the image of the field of view moves upwards and parallel to the elongated detectors, as shown in FIG. 6. In this scan direction, direct sensing of the image is contemplated without time delay integration since the same point in the image does not enter a subsequent detector until it passes the distance inbetween requiring storage during the time interval for time delay integration. With vertical scan orthogonal to arrow 105 and without time delay integration, each detector would provide a signal indicative of the radiation received from a field of view. To display and hold an entire field of view, each detector signal would need to be stored in a suitable storage media (not shown) for each resolution element until the scan is complete wherein the data could be read out of the storage media in a preferred order to create a horizontal or vertical line scan of the field of view on a viewing screen, such as a cathode ray tube.

FIGS. 7a through 15a show a cross-section view along the lines XVa—XVa of FIG. 1 illustrating the process steps to fabricate the invention of FIG. 1. FIGS. 7B through 15B show a cross-section view along the lines XVB—XVB of FIG. 1, illustrating the process steps to fabricate the invention of FIG. 1. The first step in fabricating a monolithic detector/intregal mirror combination is shown in FIGS. 7A and 7B which show a substrate 10. Substrate 10 may be doped uniformly to $2.5 \times 10^{17}$ atoms of indium per cubic centimeter. Substrate 10 may be in the neighborhood of 0.178 millimeters thick and 2.54 centimeters in diameter and monocrystalline silicon of $<110>$-orientation. The doping level of $2.5 \times 10^{17}$ atoms per cubic centimeter is a reasonable value of doping, considered consistent with a low noise sensor system, and consistent with 50% quantum efficiency in a double pass 1 millimeter long detector/light pipe system. Next, all processing steps associated with conventional charge couple device fabrication up to but not including the aluminum metal gate step is performed to provide the signal processing circuitry 24 and 34. In addition, p+ diffusions 87 and 114 are made for elongated detectors 20 and 30. Next, a 500 Å protective silicon nitride $(Si_3N_4)$ coating layer 115 is applied to the upper surface to protect the signal processing circuitry 24 and 34 from attack by a 44% potassium hydroxide (KOH) etch used subsequently to form grooves. The silicon nitride coating layer 115 can be seen in FIGS. 8A and 8B. In FIGS. 9A and 9B, the silicon nitride layer 115 is opened to expose the upper surface 12 of the silicon substrate 10 for subsequent etching to form grooves between the elongated detectors. Next, the grooves are formed by etching the exposed silicon surfaces with 44% potassium hydroxide at 65° C. to provide a groove 22 and 32 as shown in FIGS. 10A and 10B. In FIG. 10B, grooves 68 through 71 are grooves from the group of grooves 32. The grooves are typically 10 microns wide and 40 microns deep. The side walls of the grooves are then reoxidized forming silicon dioxide layer 117, as shown in FIG. 10B.

The present surface of substrate 10, silicon nitride layer 115 is mounted on an apiezon wax coated disc and the back or lower surface 14 of substrate 10 is etched in a mixture of 25:10:3 HNO₃/Acetic acid/HF until the bottom of the oxidized grooves 22 and 32 are exposed. The apiezon wax coated disc 118 is shown in FIGS. 11A and 11B. A thick outer rim 119 on the perimeter of substrate 10 is maintained for handling purposes to prevent breakage. Since the grooves 22 and 32 were about 40 microns deep, the silicon in the center region is approximately 40 microns thick after etching the lower surface of substrate 10.

A back oxide layer 121 is deposited on the exposed lower surface or bottom of substrate 10 as shown in FIGS. 12A and 12B. An opening or slot is formed in oxide layer 121 to expose substrate 10 for subsequent etching to form a first reflecting surface 16 and a second reflecting surface 29. The opening or slot in oxide layer 121 has sides or edges 122 and 123 which are spaced about 10 microns apart to expose a silicon strip 10 microns wide of substrate 10 and has a length equal to the desired length of the first and second reflecting surfaces 16 and 29. The opening or slot in oxide layer 121 may be made using photoresist and projection printing to expose the photoresist which may be developed to provide a protective shield over areas of oxide layer 121 and to allow etching of oxide layer 121 in desired areas. In addition, an opening in oxide layer 121 having oxide opening or edge sides 124 and 125 may be made in the form of a slot to expose substrate 10, which subsequently may be etched to form back reflector 50 for the elongated detectors 20. An opening in oxide layer 121 in the form of a slot having sides or edges 126 and 127 as shown in FIG. 13A may be formed to expose substrate 10 which may be subsequently etched to form back reflector 52 for elongated detectors 30. It is understood that the formation of back reflectors 50 and 52 is not necessary for the operation of the embodiment of the invention in its simplest form.

Next, the exposed substrate 10 provided by openings having sides 122 through 127 is etched using an anisotropic etch, such as 44% KOH, to form a reflecting surface or reflecting facets 16 and 29 in substrate 10 and back reflectors 50 and 52. Subsequently, the oxide layer 121 is removed and a p+ diffusion 98 is made underneath on the bottom side of substrate 10 opposite p+ diffusions 87 and 114 to form elongated detectors 20 and 30. The p+ diffusion 98 forms the bottom ohmic contact of elongated detectors 20 and 30. Next, a metal contact, such as Ti-Au layer 131 is sputtered such as 50 Å of Ti and 100 Å of Au on the underside of substrate 10. In addition, a copper layer 132 is plated on the underside of substrate 10 to a thickness such as 50 microns over top the Ti-Au layer 131, as shown in FIGS. 14A and 14B.

Finally, the thin silicon nitride layer 115 on the top of substrate 10 as shown in FIGS. 14A and 14B is removed such as by hot phosphoric acid and the final charge couple device processing steps including aluminum evaporation, contact etch and via or feed through etch are completed. The aluminum is shown by reference number 135. During this processing, the copper layer 132 on the underside of substrate 10 is protectively sealed from the chemical etchants by apiezon wax. Substrate 10 is sawed into separate arrays, such as shown in FIG. 1 or in FIG. 6. FIGS. 15A and 15B show a cross-section of FIG. 1 along the lines XVA—XVA for FIG. 15A and along the lines XVB—XVB for FIG. 15B. It is understood that the Ti-Au layer 131 and the copper layer 132 are additional material to facilitate reflecting surfaces and to provide mechanical support and a common contact for thermal cooling. The simplest embodiment of the invention may operate without the benefits of the Ti-Au layer 131 and the copper layer 132.

Figure 16:
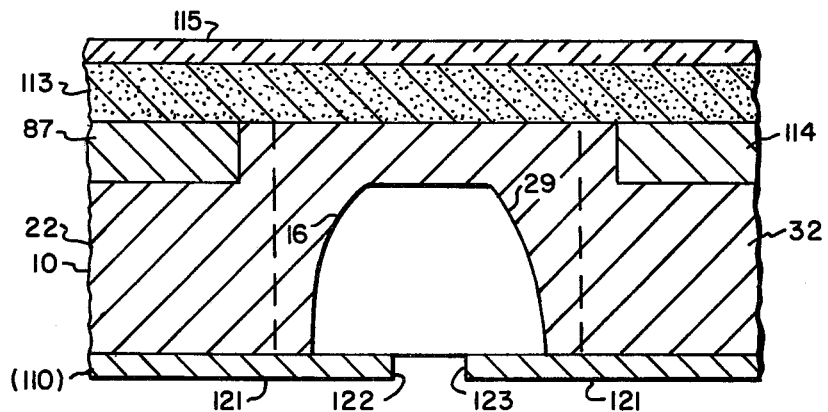
FIG. 16 shows an enlarged view within the envelope 138 of FIG. 13a of the shape of two reflecting surfaces.

FIG. 16 shows an enlarged view within the envelope 138 of FIG. 13A of the shape of two reflecting surfaces. In FIG. 16 an oxide mask 121 having an opening in the form of a slot is aligned perpendicular to the <111> directions on a (110) silicon surface adjacent oxide layer 121. The sides of the slot in oxide layer 121 are shown by oxide opening sides 122 and 123. Silicon substrate 10 in the area of the opening of oxide layer 121 may be etched using an isotropic etch of 25:10:6 mixture of nitric, acetic, and hydrofluoric acids (HNO₃/HA$_c$/HF). As shown in FIG. 16, first reflecting surface 16 and second reflecting surface 29 formed by an isotropic etch are smooth and steep sided, greater than 45° to the lower surface. The cross-section as it appears in FIG. 16 is uniform along the length of first and second reflecting surfaces 16 and 29, as shown in a plan view in FIG. 1.

Figure 17:
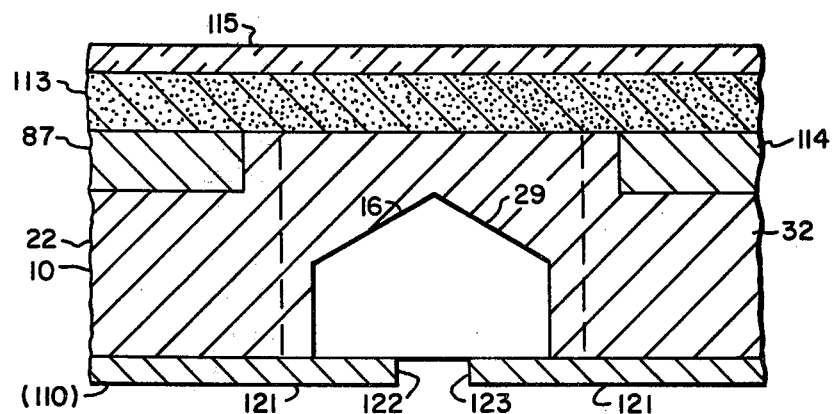
FIG. 17 shows an enlarged view within the envelope 138 of FIG. 13a of an alternate shape of two reflecting surfaces.

FIG. 17 shows an enlarged view within the envelope 138 of FIG. 13A of an alternate shape of two reflecting surfaces formed by an anisotropic etch. In FIG. 17 an opening in oxide layer 121 in the form of a slot is aligned perpendicular to the 111 directions on a (110) silicon surface adjacent oxide layer 121. The sides of the slot are shown in FIG. 17 by oxide opening sides 122 and 123 which extend lengthwise orthogonal to plane of the figure. An anisotropic etch, namely 44% potassium hydroxide (KOH) at 65° C. was used to fabricate smooth, flat, integral 30° reflector facets to form first reflecting surface 16 and second reflecting surface 29 in silicon substrate 10. The cross-sections of first and second reflecting surfaces 16 and 29 as they appear in FIG. 17 are uniform along their length which is shown in a plan view in FIG. 1.

Therefore in summary, the invention provides a method and apparatus for converting radiant energy into electrical signals comprising a cyrstalline substrate having a predetermined crystalline orientation and an upper surface, the substrate including a plurality of elongated detectors for generating electronic charge in response to the passing of radiant energy through the detector, one of the elongated detectors having portions thereof physically separated from adjacent detectors by grooves in the substrate, the grooves extending into the upper surface and having sidewalls bounded by selected crystalline planes of the substrate for electrically and optically isolating the detector and adjacent detectors from each other, and wherein the crystalline substrate has a first reflecting surface for reflecting incident radiant energy into a plurality of the elongated detectors.

We claim:

1. A sensor for converting radiant energy into electrical signals comprising:
   a crystalline substrate having a predetermined crystalline orientation and an upper surface,
   said substrate including a plurality of elongated detectors for generating electronic charge in response to the passing of radiant energy through said detector,
   one of said elongated detectors having portions thereof physically separated from adjacent detectors by grooves extending into the upper surface and having sidewalls bounded by selected crystalline planes of said substrate for electrically and optically isolating said detector and adjacent detectors from each other, and wherein said crystalline substrate has a first reflecting surface for reflecting incident radiant energy into a plurality of said elongated detectors.

2. The sensor of claim 1 wherein said substrate is silicon and the surface a (110)- crystal plane.

3. The sensor of claim 1 wherein said first reflecting surface is positioned to reflect incident radiant energy which is transverse to said elongated detectors.

4. The sensor of claim 1 wherein said first reflecting surface is formed by etching said substrate.

5. The sensor of claim 1 wherein said first reflecting surface is formed by removing material from said substrate.

6. The sensor of claim 1 further including signal processing circuitry on said substrate for processing the outputs of said elongated detectors.

7. The sensor of claim 1 wherein said crystalline substrate has a lower surface and wherein said first reflecting surface is formed in said lower surface of said substrate.

8. The sensor of claim 7 wherein said incident radiant energy passes through said upper surface of said substrate to said first reflecting surface.

9. The sensor of claim 2 wherein said silicon substrate forming said elongated detectors is doped with an infrared-sensitive conductivity determining impurity.

10. The sensor of claim 1 wherein said plurality of elongated detectors include means for reflecting radiant energy at the far end of said detector back through said detector towards its point of entry.

11. The sensor of claim 7 wherein said first reflecting surface on said lower surface is covered with a layer of metal.

12. The sensor of claim 1 wherein said crystalline substrate has a lower surface covered with a layer of metal.

13. The sensor of claim 1 wherein said crystalline substrate has a lower surface and wherein a plurality of said elongated detectors have electrodes formed on said upper and lower surface of said substrate in the area above and below each detector.

14. The sensor of claim 1 including a second reflecting surface positioned adjacent and parallel to said first reflecting surface for reflecting incident radiant energy into a second plurality of said elongated detectors.

15. A sensor array for converting radiant energy into electrical signals comprising:

a crystalline substrate having a predetermined crystalline orientation and an upper and lower substrate surface, said substrate including a plurality of elongated detectors for generating electronic charge response to the passing of radiant energy through said detector, one of said elongated detectors having portions thereof physically separated from adjacent detectors by grooves in said substrate, said grooves extending from the upper surface towards the lower surface and having sidewalls bounded by selected crystalline planes of said substrate for electrically and optically isolating said detector and adjacent detectors, and wherein said crystalline substrate has a plurality of reflecting surfaces divided into pairs with each reflecting surface of said pair positioned adjacent and parallel to one another for reflecting incident radiant energy into a plurality of said elongated detectors, said pairs of reflecting surfaces positioned to form a predetermined pattern for reception of radiant energy.

* * * * *